US008488333B2

(12) United States Patent
Lapassat et al.

(10) Patent No.: US 8,488,333 B2
(45) Date of Patent: Jul. 16, 2013

(54) ELECTRONIC POWER CONVERTER

(75) Inventors: Nicolas Lapassat, Villebon sur Yvette (FR); Cyrille Baviere, Palaiseau (FR)

(73) Assignee: Converteam Technology Ltd., Rugby (GB)

( * ) Notice: Subject to any disclaimer, the term of this patent is extended or adjusted under 35 U.S.C. 154(b) by 508 days.

(21) Appl. No.: 12/707,446

(22) Filed: Feb. 17, 2010

(65) Prior Publication Data
US 2010/0208446 A1    Aug. 19, 2010

(30) Foreign Application Priority Data
Feb. 18, 2009   (FR) ...................... 09 51053

(51) Int. Cl.
*H05K 7/02* (2006.01)
*H05K 7/04* (2006.01)
*H02M 7/521* (2006.01)

(52) U.S. Cl.
USPC .......................................... 361/810; 363/137

(58) Field of Classification Search
USPC ................ 361/794, 810, 811; 363/131, 137, 363/71; 307/89, 90
See application file for complete search history.

(56) References Cited

U.S. PATENT DOCUMENTS

| 4,942,511 A | * | 7/1990 | Lipo et al. ..................... 363/136 |
| 5,225,712 A | * | 7/1993 | Erdman ......................... 290/44 |
| 7,641,490 B2 | | 1/2010 | Korich et al. | |

FOREIGN PATENT DOCUMENTS

| DE | 10 2008 061 188 A1 | 7/2009 |
| EP | 1 931 024 A2 | 6/2008 |
| JP | 07274537 A | * 10/1995 |

OTHER PUBLICATIONS

Machine Translation of Sugihara JP 07274537 A attached to Office Action.*

* cited by examiner

*Primary Examiner* — Timothy Thompson
*Assistant Examiner* — Roshn Varghese
(74) *Attorney, Agent, or Firm* — Davidson, Davidson & Kappel, LLC

(57) ABSTRACT

An electronic power converter is provided. The electronic power converter includes at least one DC capacitor bank and one voltage inverter. The voltage inverter includes at least three phase modules connected to one another, each one specifically for the shaping of the current on one phase at the output of the voltage inverter. The DC capacitor bank is connected to the phase modules. The phase modules of the voltage inverter are distributed angularly around an axis in order to delimit between them a cylindrical space. The phase modules are interconnected by connection elements arranged inside the cylindrical space delimited by the phase modules. The DC capacitor bank is connected to the phase modules by the connection elements arranged inside the cylindrical space delimited by the phase modules.

17 Claims, 6 Drawing Sheets

ELECTRONIC POWER CONVERTER

This claims the benefit of French Patent Application No. 09 51053 filed on Feb. 18, 2009, and hereby incorporated by reference herein.

The present invention relates to an electronic power converter including at least one DC capacitor bank and one voltage inverter.

BACKGROUND OF THE INVENTION

Converters of this type are known, installed in parallelepiped-shaped cabinets. These converters include a voltage inverter comprising n phase modules, one module being provided for each current phase in order to define the shape of the current to be transmitted at the output of the inverter. These modules are aligned and the DC supply potentials for the various modules are interconnected by a low-inductance laminated bus, which is rectilinear due to the alignment of the phase modules. Such parallelepiped-shaped cabinets are relatively bulky and not very practical in an environment requiring miniaturization such as an undersea environment, which involves in particular an installation in an enclosure of low weight and reduced dimensions.

SUMMARY OF THE INVENTION

The present invention provides a converter, the structure of which allows installation in a reduced-size enclosure.

The present invention provides an electronic power converter wherein phase modules of the voltage inverter are distributed angularly around an axis in order to delimit between them a cylindrical space, the phase modules are interconnected by connection elements arranged inside the cylindrical space delimited by the phase modules, and the DC capacitor bank is connected to the phase modules via the connection elements arranged inside this cylindrical space delimited by the phase modules.

Such a converter may be installed in a cylindrical enclosure, and additionally provides for, by the arrangement of the various elements, a symmetry of the connection impedances.

The present invention may include the following features:
  the phase modules of the voltage inverter are regularly distributed angularly around the axis of the cylindrical space formed by the phase modules.
  each phase module of the voltage inverter includes at least one transistor and two decoupling capacitors.
  the decoupling capacitors have a positive pole, a positive/neutral pole, a neutral/negative pole and a negative pole, and the positive poles are connected to a first connection element, the positive/neutral poles are connected to a second connection element, the neutral/negative poles are connected to a third connection element, and the negative poles are connected to a fourth connection element.
  the DC capacitor bank comprises a positive voltage pole, a positive/neutral pole, a neutral/negative pole, and a negative pole, the positive voltage pole being connected to the first connection element, the positive/neutral pole being connected to the second connection element, the neutral/negative pole being connected to the third connection element, the negative pole being connected to the fourth connection element, and the DC capacitor bank is in the extension of the cylindrical space delimited by the phase modules.
  a first damping circuit, made up of at least one resistor and one capacitor, is connected at its input to the first connection element, and connected at its output to the second connection element, a second damping circuit, made up of at least one resistor and one capacitor, is connected at its input to the third connection element, and connected at its output to the fourth connection element, and the two damping circuits are arranged in the cylindrical space delimited by the phase modules.
  each phase module of the voltage inverter includes at least one transistor and one decoupling capacitor.
  the decoupling capacitor has a positive pole and a negative pole, and the positive pole is connected to a first connection element and the negative pole is connected to a second connection element.
  the DC capacitor bank comprises a positive voltage pole and a negative pole, the positive voltage pole being connected to the first connection element and the negative pole being connected to the second connection element, and the DC capacitor bank is in the extension of the cylindrical space delimited by the phase modules.
  a first damping circuit, made up of at least one resistor and one capacitor, is connected at its input to the first connection element, at its output to the second connection element, and the damping circuit is arranged in the cylindrical space delimited by the phase modules.
  the connection elements are formed by an n-sided polygon, where n is the number of phase modules.
  the voltage inverter includes three phase modules, and the connection elements are triangular elements.
  the inverter and the DC capacitor bank are mechanically fixed to a truss support structure.
  the support structure has a hexagonal shape, such that a face of this structure is parallel to each of the phase modules.
  the truss support structure is mechanically fixed to a sealed casing.

BRIEF DESCRIPTION OF THE FIGURES

The invention will now be described in greater detail, purely by way of example and in a non-limiting manner, with reference to the appended drawings in which.

DETAILED DESCRIPTION

Figure 1:
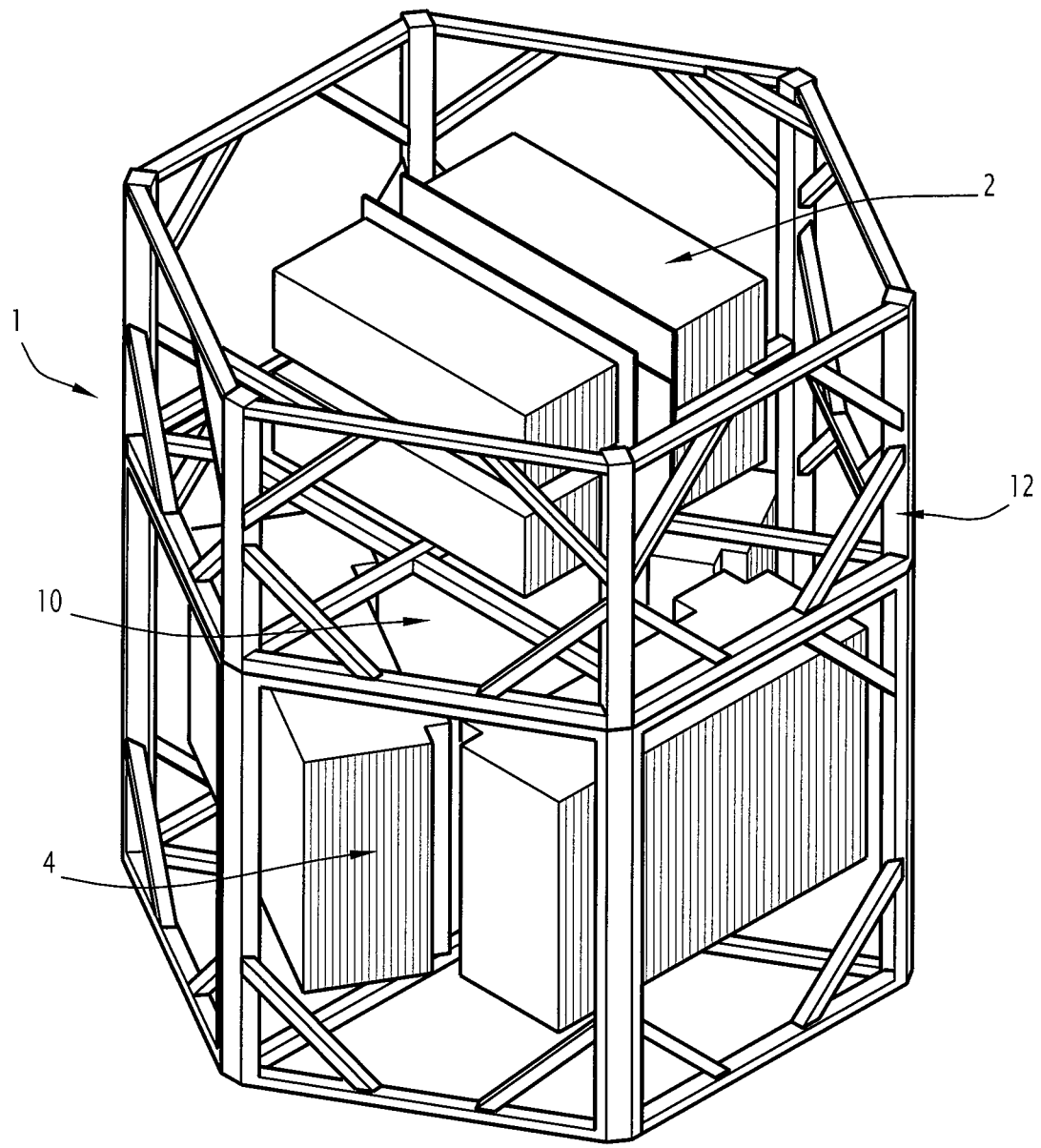
FIG. 1 is a representation of an assembly of a converter according to a first embodiment of the invention.
Figure 2:
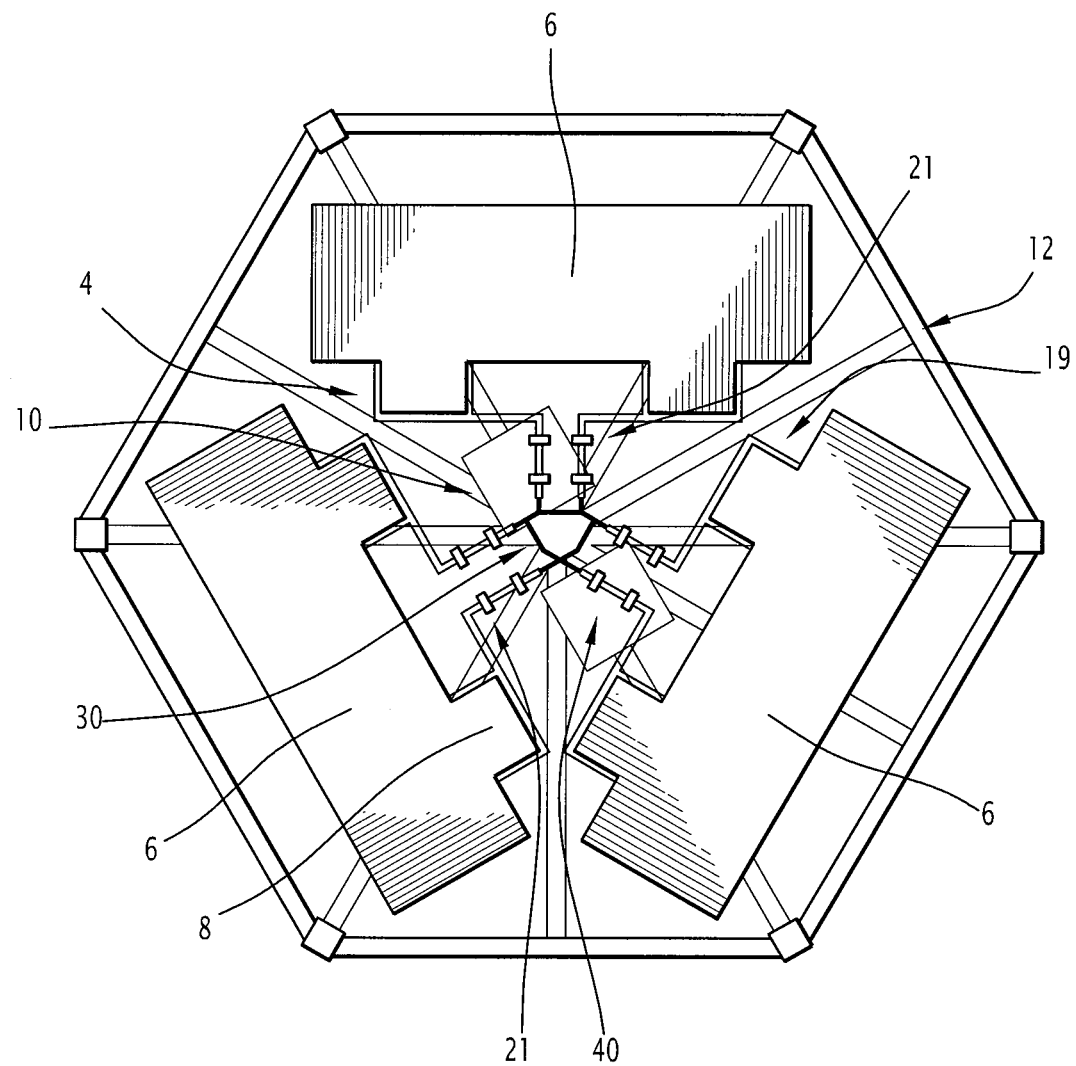
FIG. 2 is the view from above of the inverter of the converter of FIG. 1.
Figure 3:
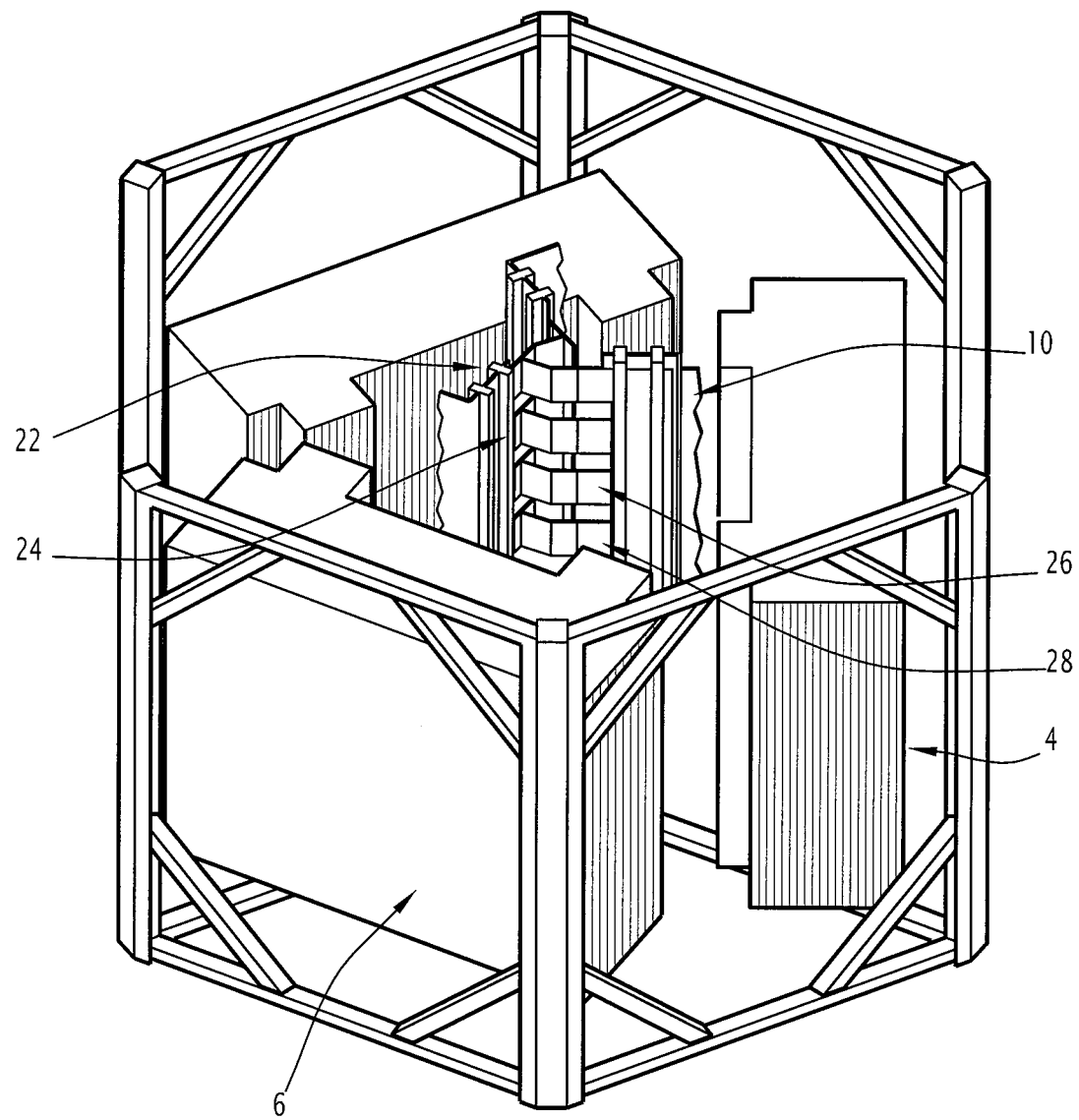
FIG. 3 is a perspective view of the inverter of FIG. 2.

An electronic power converter 1 according to the invention is intended, for example, to be connected to an electric motor, in order to supply it. Such a motor can in particular be used for a very deeply submerged compressor.

The converter comprises a DC capacitor bank 2 and a voltage inverter 4, this assembly being intended to supply the energy required for the operation of the motor driven at the output of the inverter. At the input of the capacitor bank, the converter includes a rectifier device, specifically for receiving a voltage from a supply network and for converting this voltage to DC which is stored and filtered in the DC capacitor bank 2. The voltage inverter 4 is specifically for converting this DC voltage into a variable frequency AC voltage, in order to supply the various phases of the electric motor.

The voltage inverter 4 is formed by n phase modules 6, each of these modules being associated with one of the n phases of the electric motor connected to the converter. In the example considered, the motor has three phases.

The converter according to the invention can have inverter topologies with two levels, three levels or more. The description which follows, as illustrated by FIGS. 1 to 4, relates to a three-level inverter topology.

Each phase module 6 is a subassembly comprising at least one transistor 7 and two decoupling capacitors 8. A DC input is formed at the terminals of the decoupling capacitors 8. The decoupling capacitors 8 are arranged in the phase modules 6 in order to stabilize the DC voltage entering the voltage inverter 4, from the DC capacitor bank.

According to the present invention, the phase modules 6 of the voltage inverter 4 are arranged in a circular manner, spaced one from the other by a defined angle. For the purposes of understanding the invention, an embodiment has been represented in the drawings with three phase modules, spaced by an angle of 120 degrees. As represented in FIGS. 1 to 4, the three phase modules 6 of the voltage inverter 4 are thus regularly distributed around an axis in order to delimit between them a cylindrical space 10, of a triangular base formed by these three modules.

The voltage inverter 4 is integrated in a truss support structure 12, of hexagonal outer shape, and covered by a sealed casing 13 (FIG. 5) forming a sealed enclosure bearing the sea pressure at the depth of use. The arrangement of the phase modules 6 in the support structure 12 is such that one face in two of the hexagonal shape of the casing extends in a manner parallel to and in front of each of the phase modules 6. The phase modules 6 are fixed to this truss structure.

The decoupling capacitors 8 of each phase module 6 are interconnected, and are connected to the DC capacitor bank 2, at the back of the modules 6, by connection elements placed at the centre of the cylindrical space 10 delimited by the phase modules 6.

According to the invention, there are as many connection elements as there are separate terminals in the decoupling capacitors 8 of each phase module 6. In the example embodiment represented, the decoupling capacitors 8 have four connection terminals, and four connection elements are arranged at the centre of the cylindrical space 10 delimited by the phase modules 6.

Figure 4:
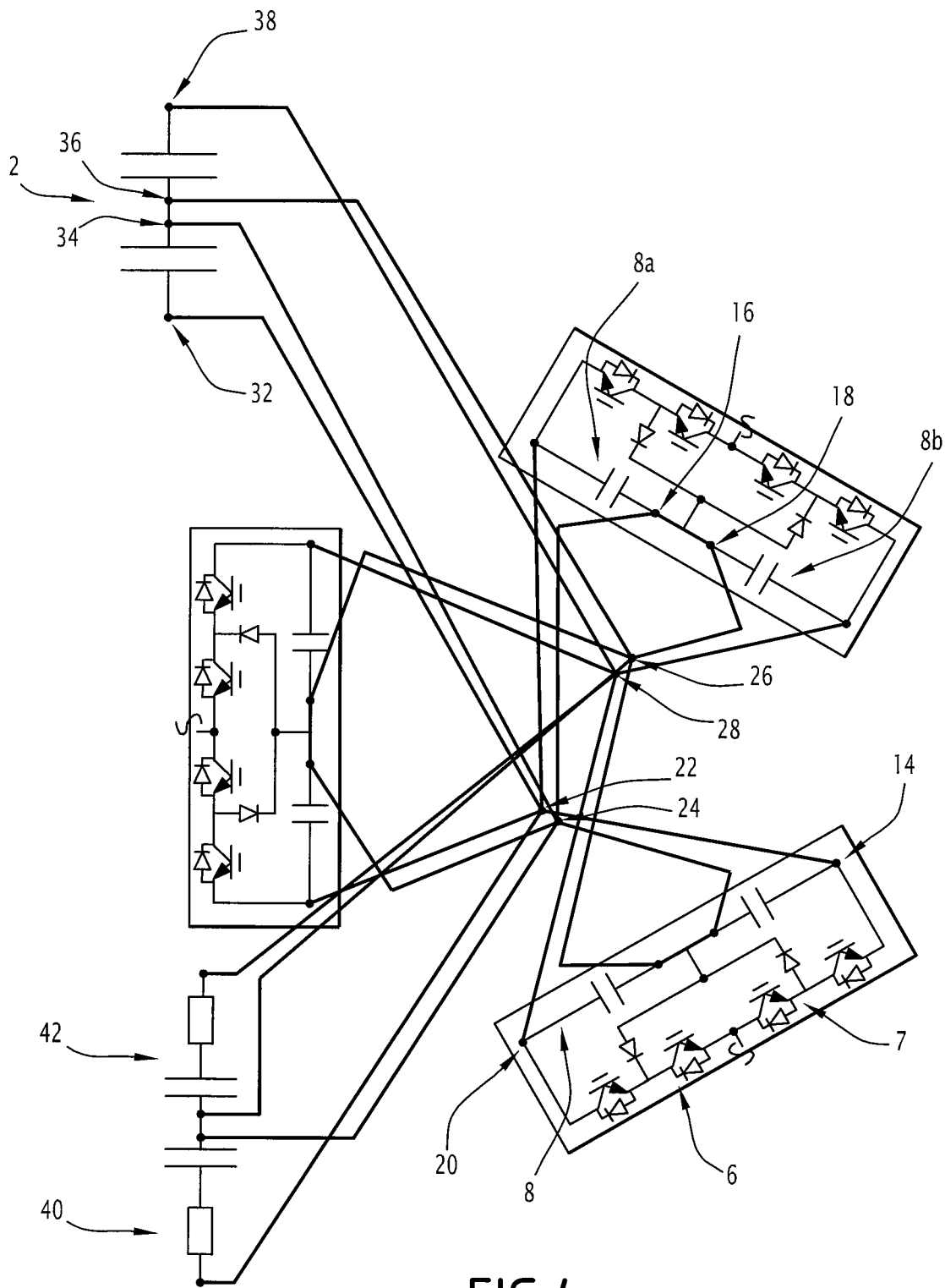
FIG. 4 is a circuit diagram representing the connection of the inverter in a converter according to the invention, for a three-level topology.

As illustrated in detail in FIG. 4, in each phase module 6, a first decoupling capacitor 8a includes a positive-polarity terminal 14 and a positive/neutral-polarity terminal 16, while the second decoupling capacitor 8b includes a neutral/negative-polarity terminal 18 and a negative-polarity terminal 20. The neutral polarity is thus distributed over two separate terminals in order to facilitate the placing, one facing the other, of the positive and neutral polarities on the one hand, and the negative and neutral polarities on the other hand, between the decoupling capacitors 8 and the connection elements.

Each phase module 6 comprises four transistors 7 connected in series and connected in the same direction, and diodes mounted in anti-parallel are connected across their terminals. One end of this series of transistors is connected to the terminal 14 and the other end of this series of transistors is connected to the terminal 20. Two diodes are mounted in series on a branch circuit, a first end of which is connected between the first and the second transistor of the series, and the other end of which is connected between the third and the fourth transistor of the series. A central branch connects the neutral-polarity terminals 16, 18 to the branch circuit, between the two diodes.

Plates 19 connect each of the terminals of the decoupling capacitors 8 to the corresponding connection element. Spacers 21 enable the plates forming the positive polarity and the neutral polarity to be brought close together without contact, and spacers 21' (not shown) enable the plates forming the negative polarity and the neutral polarity to be brought close together without contact. By bringing the plates close together, the connection of the decoupling capacitors 8 to the connection elements 22, 24, 26, 28 is made non-inductive.

The positive-polarity terminal 14 is connected to a first connection element 22, the positive/neutral-polarity terminal 16 is connected to a second connection element 24, the neutral/negative-polarity terminal 18 is connected to a third connection element 26, and the negative-polarity terminal 20 is connected to a fourth connection element 28.

Each connection element 22, 24, 26, 28 presents substantially the shape of a triangle, each side of this triangle continuing from one side in order to form a star, each branch of which is connected to a plate associated with a given input terminal of a phase module 6. Thus, the positive-polarity terminal of the decoupling capacitors of the first phase module is connected to a first side of the first connection element 22, the positive-polarity terminal of the decoupling capacitors of the second phase module is connected to a second side of the first connection element 22, and the positive-polarity terminal of the decoupling capacitors of the third phase module is connected to a third side of the first connection element 22.

The connection elements 22, 24, 26, 28 are stacked, forming a column 30 at the center of the cylindrical space 10 delimited by the phase modules 6.

Figure 5:
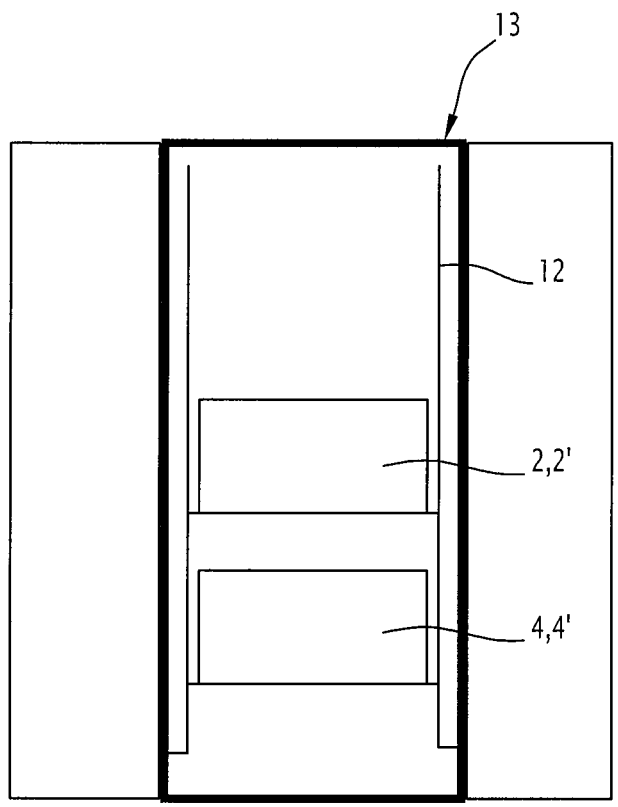
FIG. 5 is a schematic representation of the converter according to the invention and of the sealed casing which surrounding the converter.

The DC capacitor bank 2 is arranged in the electronic power converter 1 according to the invention, above the phase modules 6 of the voltage inverter 4. This DC capacitor bank 2 is contained in the upper extension of the truss support structure 12 of the electronic converter 1, as illustrated by FIG. 5.

The DC capacitor bank 2 delivers a DC voltage. It comprises a positive-polarity terminal 32, a positive/neutral-polarity terminal 34, a neutral/negative-polarity terminal 36, and a negative-polarity terminal 38. The positive-polarity terminal 32 is connected to the first connection element 22, the positive/neutral-polarity terminal 34 is connected to the second connection element 24, the neutral/negative-polarity terminal 36 is connected to the third connection element 26, and the negative-polarity terminal 38 is connected to the fourth connection element 28.

The connection of the DC capacitor bank 2 to the phase modules 6 is achieved via the connection elements 22, 24, 26, 28, by a first cable harness connecting the positive and positive/neutral polarities of the DC capacitor bank to the first and second connection elements, and by a second cable harness connecting the negative and neutral/negative polarities of the DC capacitor bank to the third and fourth connection elements. These harnesses are interwoven and thus present between them a large surface area facing one another. The link obtained is thus of low inductance and enables the connection between the decoupling capacitors 8 and the DC capacitor bank 2 to be made as non-inductive as possible, in order to limit oscillations.

A first damping circuit 40, made up of at least one resistor and one capacitor in series, is connected at its input to the first connection element 22, and connected at its output to the second connection element 24. A second damping circuit 42, made up of at least one resistor and one capacitor, is connected at its input to the third connection element 26, and connected at its output to the fourth connection element 28. These damping circuits 40, 42, by which oscillations can be damped, are arranged in the cylindrical space 10 delimited by the phase modules 6.

Figure 6:
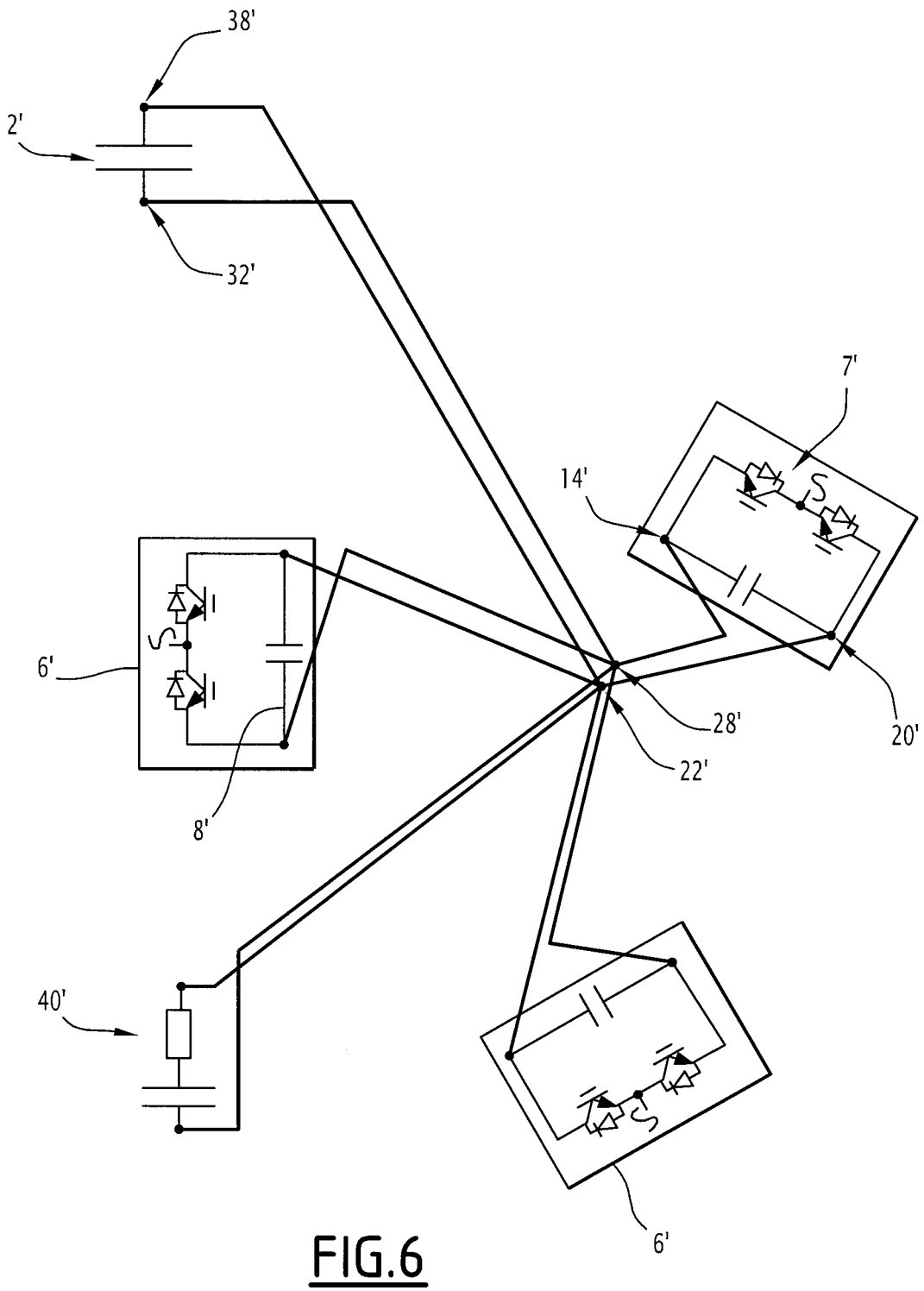
FIG. 6 is a circuit diagram equivalent to that of FIG. 4, for a two-level topology.

As illustrated by FIG. 6, the invention applies also to two-level inverter topologies. Each phase module 6' is a subassembly comprising at least one transistor 7' and one decoupling capacitor 8'. In each phase module 6', the decoupling capacitor 8' includes a positive-polarity terminal 14' and a negative-polarity terminal 20'. Two transistors 7', having diodes mounted in anti-parallel connected across their terminals, are connected in series and connected in the same direction. One end of this series of transistors is connected to the terminal 14' and the other end of this series of transistors is connected to the terminal 20'.

The positive-polarity terminal 14' is connected to a first connection element 22', and the negative-polarity terminal 20' is connected to a second connection element 28'. The DC capacitor bank 2' comprises a positive-polarity terminal 32' and a negative-polarity terminal 38'. The positive-polarity terminal 32' is connected to the first connection element 22', and the negative-polarity terminal 38' is connected to the second connection element 28'. A damping circuit 40' is connected at its input to the first connection element 22', and at its output to the second connection element 28'.

In submerged applications in undersea environments, the sealed casings 13 surrounding the converter are designed with a reduced cross-section in comparison with the height, in order to limit the wall thickness of the undersea casing, and therefore the weight of this casing. This weight is predominant in the total weight of the converter and leads to constraints that can be deciding factors on the logistics plan. The installation of an inverter optimizing the cylindrical volume available is an advantage for this type of application.

The DC capacitor bank 2 and the voltage inverter 4 are mechanically fixed to the truss support structure 12, which is mechanically fixed to the sealed casing 13 which bears the pressure of the water.

The truss support structure 12 enables the phase modules 6 to be fitted. Inside this truss support structure 12, the specific arrangement of the phase modules 6 generates a free space allowing the connection elements 22, 24, 26, 28 of these phase modules to be put in place.

The invention applies to any type of converter, regardless of the topology of the phases of the inverter, since the phase modules of the inverter form a cylinder within which the poles of the decoupling capacitors of this inverter are interconnected.

The fact that the interconnection, described above, of the phase modules 6 is carried out inside the cylindrical space 10 delimited by these phase modules 6 means that this interconnection can be made symmetrical and compact. The decoupling capacitors 8 mounted directly in the phase modules 6 are thus brought close to one another, unlike in a rectilinear arrangement in which a decoupling capacitor can be found at variable distances from other decoupling capacitors. This provides for reducing the interconnection inductance between the decoupling capacitors 8 brought close together and therefore enables the oscillation currents between these capacitors 8, which can be a source of heating limiting their life, to be limited.

As mentioned previously, the description above related to an embodiment of the invention formed by three phase modules arranged at 120 degrees. But the regular angular arrangement of the phase modules can be set up for a number of phase modules that is different from three. The inverter according to the invention can comprise n phase modules, where n is an integer greater than or equal to three, and these n phase modules are hence arranged in a circular manner, spaced angularly one from the other by an angle of 360/n degrees. The connection elements of the phase modules then take the shape of an n-sided polygon, or of an n-branched star, in order that each side or branch can be associated with one of the modules, just as the triangular shape in the example embodiment above enables each of the sides to be associated with one of the three phase modules. This enables both the impedances of the connections between these n phase modules to be made symmetrical and the installation in the cylinder to be optimized.

What is claimed is:

1. An electronic power converter including: at least one DC capacitor bank; and a voltage inverter including at least three phase modules connected to one another, each of the at least three phase modules including at least one decoupling capacitor, each one of the at least three phase modules specifically for shaping a current on a phase at an output of the voltage inverter, the at least three phase modules being distributed angularly around an axis in order to delimit a cylindrical space therebetween, the at least three phase modules being interconnected by connection elements arranged inside the cylindrical space, the at least one DC capacitor bank being connected to the phase modules via the connection elements arranged inside the cylindrical space delimited by the phase modules, the at least one decoupling capacitor being distinct from the at least one DC capacitor bank.

2. The electronic power converter according to claim 1, wherein the at least three phase modules of the voltage inverter are regularly distributed angularly around the axis of the cylindrical space formed by the phase modules.

3. The electronic power converter according to claim 1, wherein each of the at least three phase modules of the voltage inverter include at least one transistor and two decoupling capacitors, the two decoupling capacitors being distinct from the at least one DC capacitor bank.

4. The electronic power converter according to claim 3, wherein the two decoupling capacitors have a positive pole, a positive/neutral pole, a neutral/negative pole and a negative pole, the positive poles being connected to a first connection element, the positive/neutral poles being connected to a second connection element, the neutral/negative poles being connected to a third connection element, and the negative poles being connected to a fourth connection element.

5. The electronic power converter according to claim 4, wherein the DC capacitor bank includes a positive voltage pole, a positive/neutral pole, a neutral/negative pole, and a negative pole, the positive voltage pole being connected to the first connection element, the positive/neutral pole being connected to the second connection element, the neutral/negative pole being connected to the third connection element, and the negative pole being connected to the fourth connection element, the DC capacitor bank being in an extension of the cylindrical space delimited by the phase modules.

6. The electronic power converter according to claim 4, further comprising a first damping circuit including at least one resistor and one capacitor connected at an input to the first connection element and connected at an output to the second connection element and a second damping circuit including at least one resistor and one capacitor connected at an input to the third connection element and connected at an output to the fourth connection element, the first and second damping circuits being arranged in the cylindrical space delimited by the phase modules.

7. The electronic power converter according claim 4, wherein the connection elements form an n-sided polygon, where n is a number of the at least three phase modules.

8. The electronic power converter according to claim 7, wherein the voltage inverter includes three phase modules and the connection elements are triangular elements.

9. The electronic power converter according to claim 1, further comprising a truss support structure, the inverter and the DC capacitor bank being mechanically fixed to the truss support structure.

10. The electronic power converter according to claim 9, wherein the truss support structure has a hexagonal shape, a face of the truss structure being parallel to each of the at least three phase modules.

11. The electronic power converter according to claim 9, further comprising a sealed casing, the truss support structure being mechanically fixed to the sealed casing.

12. The electronic power converter according to claim 1, wherein each of the at least three phase modules of the voltage inverter include at least one transistor and one decoupling capacitor.

13. The electronic power converter according to claim 12, wherein the decoupling capacitor has a positive pole and a negative pole, the positive pole being connected to a first connection element, the negative pole being connected to a second connection element.

14. The electronic power converter according to claim 13, wherein the DC capacitor bank includes a positive voltage pole and a negative pole, the positive voltage pole being connected to the first connection element, the negative pole being connected to the second connection element, the DC capacitor bank being in an extension of the cylindrical space delimited by the phase modules.

15. The electronic power converter according to claim 13, further comprising a first damping circuit including at least one resistor and one capacitor connected at an input to the first connection element and connected at an output to the second connection element, the damping circuit being arranged in the cylindrical space delimited by the phase modules.

16. The electronic power converter according to claim 13, wherein the connection elements form an n-sided polygon, where n is a number of the at least three phase modules.

17. The electronic power converter according to claim 16, wherein the voltage inverter includes three phase modules and the connection elements are triangular elements.

* * * * *